(12) United States Patent
Liou et al.

(10) Patent No.: US 8,912,664 B1
(45) Date of Patent: Dec. 16, 2014

(54) LEADLESS MULTI-CHIP MODULE STRUCTURE

(71) Applicant: Marvell International Ltd., Hamilton (BM)

(72) Inventors: Shiann-Ming Liou, Campbell, CA (US); Huahung Kao, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/195,625

(22) Filed: Mar. 3, 2014

Related U.S. Application Data

(60) Continuation of application No. 13/745,554, filed on Jan. 18, 2013, now Pat. No. 8,669,139, which is a division of application No. 12/196,948, filed on Aug. 22, 2008, now Pat. No. 8,358,013.

(60) Provisional application No. 60/968,752, filed on Aug. 29, 2007.

(51) Int. Cl.
*H01L 23/48* (2006.01)
*H01L 23/495* (2006.01)

(52) U.S. Cl.
CPC .................................. *H01L 23/4951* (2013.01)
USPC ........................................................ 257/777

(58) Field of Classification Search
CPC .............. H01L 25/0657; H01L 25/105; H01L 2924/15311; H01L 2924/01079; H01L 2224/48091
USPC .......................... 257/686, 685, 777–781, 784
See application file for complete search history.

(56) References Cited

U.S. PATENT DOCUMENTS

| | | | |
|---|---|---|---|
| 6,753,599 B2 | 6/2004 | Kim | |
| 2005/0098869 A1 | 5/2005 | Shiozawa | |
| 2006/0113678 A1* | 6/2006 | Roeters et al. | 257/777 |
| 2007/0018299 A1* | 1/2007 | Koo et al. | 257/686 |
| 2007/0102803 A1 | 5/2007 | Gann | |
| 2008/0017966 A1* | 1/2008 | Williams et al. | 257/686 |
| 2008/0157325 A1 | 7/2008 | Chow et al. | |

* cited by examiner

*Primary Examiner* — Hoa B Trinh

(57) ABSTRACT

Multi-chip quad flat no-lead (QFN) packages and methods for making the same are disclosed. A multi-chip package may include a first die including a plurality of first bond pads, wherein selected first bond pads are wire-bonded to a first side of a leadframe, and a second die mounted on the first die and including a plurality of second bond pads, wherein selected second bond pads are wire-bonded to a second side, opposite the first side, of the leadframe. Another package may include a first die including a plurality of first bond pads, wherein selected first bond pads are wire-bonded to a first side of a leadframe, and a second die flip-chip mounted on a second side of the leadframe and including a plurality of second bond pads, wherein selected second bond pads are bonded to the second side of the leadframe. Other embodiments are also described.

15 Claims, 6 Drawing Sheets

LEADLESS MULTI-CHIP MODULE STRUCTURE

CROSS-REFERENCE TO RELATED APPLICATIONS

The present disclosure is a continuation of and claims priority to U.S. patent application Ser. No. 13/745,554, filed Jan. 18, 2013, now U.S. Pat. No. 8,669,139, issued on Mar. 11, 2014, which is a divisional of and claims priority to U.S. patent application Ser. No. 12/196,948, filed Aug. 22, 2008, now U.S. Pat. No. 8,358,013, issued Jan. 22, 2013, which claims priority to U.S. Provisional Patent Application No. 60/968,752, filed Aug. 29, 2007, which are incorporated herein by reference.

TECHNICAL FIELD

Embodiments of the present invention relate to the field of microelectronic device packaging and, more particularly, to multi-chip quad flat no-lead (QFN) packaging designs and processes.

BACKGROUND

In the current state of integrated circuit technology, an integrated circuit device will often be in the form of a die. Such a die will typically be mounted onto an underlying substrate such as a carrier substrate to form a package. For example, some packages will include one or more dies coupled to a substrate such as a leadframe, which is frequently made of copper or copper alloy material, and may include a die paddle to support the die.

Attention has increasingly shifted to multi-chip microelectronic packaging as a way to help meet the demands for enhanced system performance. As demand increases, it has become necessary to use multiple dies or microelectronic packages that work in conjunction with one another. This is sometimes accomplished by stacking multiple packages. This stacking, however, may lead not only to increased transmission distances, but also to decreased packaging density.

SUMMARY

In view of the problems in the state of the art, embodiments of the present invention are directed to multi-chip QFN packaging designs and processes. More specifically, there is provided, in accordance with various embodiments of the present invention, an apparatus comprising a first die including a plurality of first bond pads, wherein selected first bond pads are wire-bonded to a first side of a leadframe, and a second die mounted on the first die and including a plurality of second bond pads, wherein selected second bond pads are wire-bonded to a second side, opposite the first side, of the leadframe.

In various embodiments, the plurality of first bond pads may be disposed on a front side of the first die and the selected first bond pads may be wire-bonded to the first side of the leadframe by a plurality of first wires. In some embodiments, a mold compound may encapsulate the front side of the first die and the plurality of first wires.

In various embodiments, the plurality of second bond pads may be disposed on a front side of the second die and the selected second bond pads may be wire-bonded to the second side of the leadframe by a plurality of second wires. In various embodiments, a mold compound may encapsulate the front side of the second die and the plurality of second wires.

In various embodiments, a die-attach material may affix a back side of the second die to a back side the first die.

In various embodiments, the leadframe, the first die, and the second die form a first package. In some embodiments, the apparatus may further comprise a second package, the first package being coupled with the second package. In some embodiments, the first package may be electrically interconnected with the second package by a plurality of conductive bumps.

A method is also described. In various embodiments, the method may comprise providing a leadframe including a first side and a second side opposite the first side, wire-bonding selected first bond pads of a first die to the first side of the leadframe, mounting a second die on the first die, and wire-bonding selected second bond pads of a second die to the second side of the leadframe.

In various embodiments, the selected first bond pads may be disposed on a front side of the first die and the selected first bond pads may be wire-bonded to the first side of the leadframe by a plurality of first wires. In some embodiments, the method may further comprise encapsulating the front side of the first die and the plurality of first wires with a mold compound.

In various embodiments, the selected second bond pads may be disposed on a front side of the second die and the selected second bond pads may be wire-bonded to the second side of the leadframe by a plurality of second wires. In some embodiments, the method may further comprise encapsulating the front side of the second die and the plurality of second wires with a mold compound.

In various embodiments, the mounting of the second die on the first die may include affixing the second die to the first die with a die-attach material.

In various embodiments, the method may further comprise forming a first package including the leadframe, the first die and the second die, and the method may further comprise coupling the first package with a second package. In some embodiments, the coupling of the first package with the second package may comprise electrically interconnecting the first package with the second package by a plurality of conductive bumps.

Another apparatus is also described. In various embodiments, the apparatus may comprise a first die including a plurality of first bond pads, wherein selected first bond pads are wire-bonded to a first side of a leadframe, and a second die flip-chip mounted on a second side of the leadframe and including a plurality of second bond pads, wherein selected second bond pads are bonded to the second side of the leadframe.

In various embodiments, the plurality of first bond pads may be disposed on a front side of the first die and the selected first bond pads may be wire-bonded to the first side of the leadframe by a plurality of first wires. In some embodiments, a mold compound may encapsulate the front side of the first die and the plurality of first wires.

In various embodiments, the plurality of second bond pads may be disposed on a front side of the second die and the selected second bond pads may be bonded to the second side of the leadframe by a plurality of conductive bumps.

In various embodiments, an underfill material may be disposed between the first die and the second die.

In various embodiments, the leadframe, the first die, and the second die may form a first package. In some embodiments, the apparatus may further comprise a second package, the first package being coupled with the second package. In some embodiments, the first package may be electrically interconnected with the second package by a plurality of conductive bumps.

Another method is also described. In various embodiments, the method may comprise providing a leadframe including a first side and a second side opposite the first side, wire-bonding selected first bond pads of a first die to the first side of the leadframe, and flip-chip mounting a second die to the second side of the leadframe.

In various embodiments, the selected first bond pads may be disposed on a front side of the first die and the selected first bond pads may be wire-bonded to selected first conductive contacts of the leadframe by a plurality of first wires. In some embodiments, the method may further comprise encapsulating the front side of the first die and the plurality of first wires with a mold compound.

In various embodiments, a plurality of second bond pads may be disposed on a front side of the second die and selected second bond pads may be bonded to selected second conductive contacts of the leadframe by a plurality of conductive bumps.

In various embodiments, the flip-chip mounting of the second die to the second side of the leadframe may include bonding selected second bond pads of the second die to the second side of the leadframe.

In various embodiments, the method may further comprise disposing an underfill material between the first die and the second die.

In various embodiments, the method may further comprise forming a first package including the leadframe, the first die and the second die. In some embodiments, the method may further comprise coupling the first package with a second package. In some embodiments, the coupling of the first package with the second package may comprise electrically interconnecting the first package with the second package by a plurality of conductive bumps.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The terms "coupled to," along with its derivatives, may be used herein. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The terms chip, die, integrated circuit, monolithic device, semiconductor device, and microelectronic device are often used interchangeably in the microelectronics field. The present invention is applicable to all of the above as they are generally understood in the field.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

Various embodiments of the present invention are directed to multi-chip QFN packages and methods for making the same.

Figure 1:
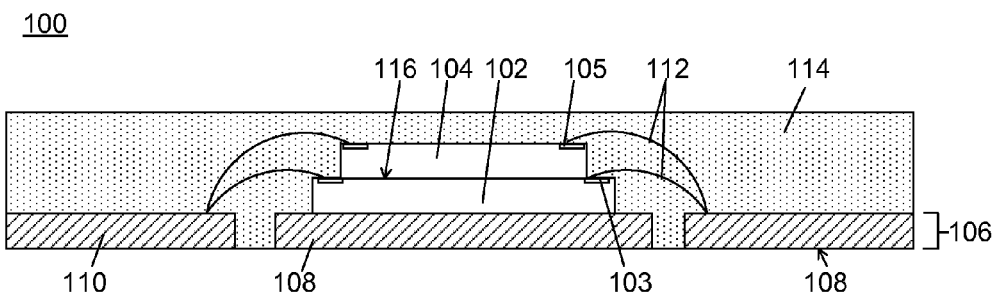
FIGS. 1-3 illustrate cross-sectional side views of related art microelectronic apparatuses.

Various embodiments of the present invention may be more easily understood in the context of related art. A cross-sectional side view of a typical related art multi-chip microelectronic package 100 is illustrated in FIG. 1. As illustrated, package 100 includes a first microelectronic die 102 mounted onto a die paddle 108 of a leadframe 106, and a second microelectronic die 104 mounted onto first die 102. Bond pads 103, 105 of first and second dies 102, 104, respectively, are wire-bonded to lead fingers 110 of leadframe 106 by wires 112. A mold compound 114 encapsulates first and second dies 102, 104 and wires 112 to form package 100. Package 100 may then be mounted onto a substrate (e.g., a printed circuit board; not illustrated), and electrical interconnection with first and second dies 102, 104 may be established by interconnecting pads (not illustrated) located on a back side 118 of leadframe 106 with the substrate.

Figure 2:
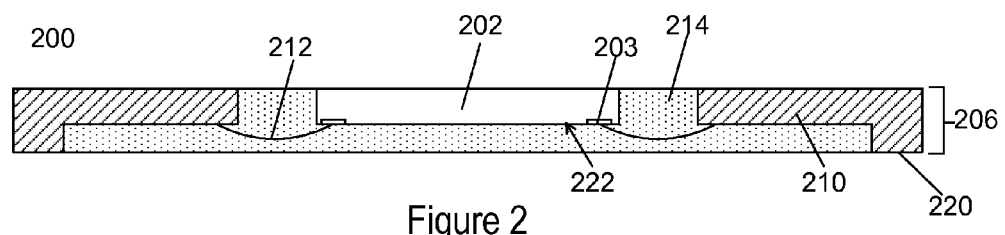

Package 100 illustrated in FIG. 1 is a die-up configuration, wherein first and second dies 102, 104 are front/active side 116 facing upward (i.e., opposite the back side 118 of leadframe 106). Another possible configuration is the die-down configuration as illustrated in FIG. 2. This configuration may provide various benefits including, for example, exposing a back side (or a die paddle onto which the back side of a die is mounted) for heat dissipation.

FIG. 2 illustrates a related art die-down package 200 including die 202. Bond pads 203 of die 202 are wire-bonded to lead fingers 210 of a leadframe 206 by wires 212. A mold compound 214 encapsulates die 202 and wires 212 to form package 200. Package 200 may then be mounted onto a substrate (e.g., a printed circuit board; not illustrated), and electrical interconnection with die 202 may be established by interconnecting pads 220 of leadframe 206 with the substrate.

As may be seen in FIG. 2, the size of leadframe 206 may not be sufficient to accommodate stacking of another die onto a front side 222 of die 202 (similar to that done for package 100 illustrated in FIG. 1). To do so may require a re-configuration of leadframe 206 altogether to accommodate the thickness of another die while still allowing pads 220 to make contact with a substrate. Accordingly, multi-chip modules may be formed by stacking of packages themselves, as opposed to stacking dies, as illustrated in FIG. 3.

Figure 3:
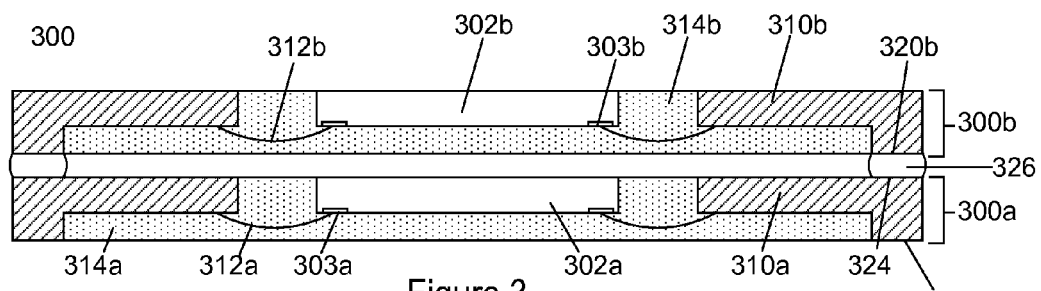

As illustrated in FIG. 3, packages 300a and 300b are stacked, with pad 320b of package 300b electrically interconnected with pad 324 of package 300a by a conductive bump 326. Similar to package 200 illustrated in FIG. 2, packages 300a, 300b each include a die 302a, 302b. Bond pads 303a, 303b of dies 302a, 302b are wire-bonded to lead fingers 310a, 310b of a leadframe 306a, 306b by wires 312a, 312b. A mold compound 314a, 314b encapsulates dies 302a, 302b and wires 312a, 312b to form packages 300a, 300b. Package 300a may then be mounted onto a substrate (e.g., a printed circuit board; not illustrated), and electrical interconnection with die 302a and die 302b may be established by interconnecting pads 320a of leadframe 300a with the substrate.

The module illustrated in FIG. 3 may be suitable for some applications, but there may be trade-offs with stacking packages. Among possible trade-offs is the increased overall module size associated with stacking packages in a manner such as that illustrated in FIG. 3. Moreover, the leadframes 300a, 300b must be the same size in order for pad 320b and pad 324 to align, or must be specifically configured such that pad 320b and pad 324 align.

Figure 4:
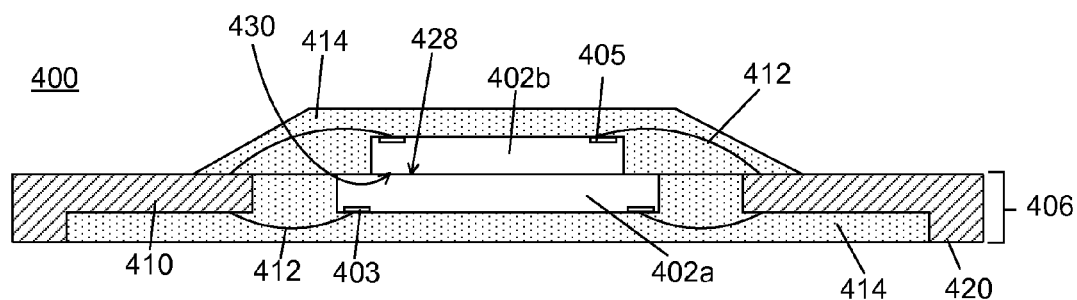
FIG. 4 illustrates a cross-sectional side view of a microelectronic apparatus in accordance with various embodiments of the present invention.

Various embodiments of the present invention are directed to multi-chip QFN packages and methods for making the same. An exemplary embodiment of a multi-chip QFN package in accordance with the present invention is illustrated in FIG. 4. As illustrated, package 400 may include a first die 402a in a die-down configuration, and a second die 402b mounted onto a back side 428 of first die 402a. Bond pads 403, 405 of first die 402a and second die 402b, respectively, may be wire-bonded to lead fingers 410 of a leadframe 406 by wires 412. A mold compound 414 may encapsulate first die 402a, second die 402b, and wires 412. Package 400 may then be mounted onto a substrate (e.g., a printed circuit board; not illustrated), and electrical interconnection with first die 402a and/or second die 402b may be established by interconnecting pads 420 of leadframe 406 with the substrate.

An exemplary method for making package 400 is illustrated in FIGS. 5-9 as cross-sectional side views at various stages of the method. For clarity, the same reference numerals used with respect to FIG. 4 are used in the discussion to follow with respect to FIGS. 5-9. Also, as noted herein, the various operations discussed and/or illustrated may be generally referred to as multiple discrete operations in turn to help in understanding embodiments of the present invention. The order of description should not be construed to imply that these operations are order dependent, unless explicitly stated. Moreover, some embodiments may include more or fewer operations than may be described.

Figure 5:
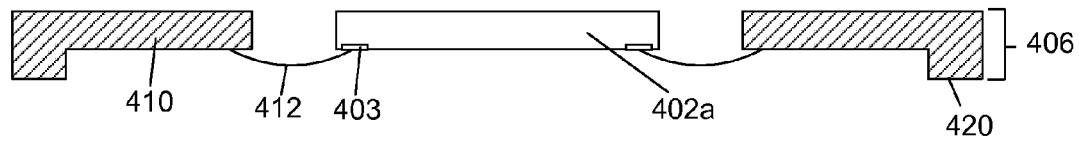
FIGS. 5-9 illustrate cross-sectional side views of the microelectronic apparatus of FIG. 4 at various stages of a method for forming the same in accordance with various embodiments of the present invention.

Turning now to FIG. 5, a leadframe 406 and a first die 402a are provided, and bond pads 403 of first die 402a may be wire-bonded to lead fingers 410 of leadframe 406 by wires 412. First die 402a may be in a die-down configuration, with a front side 422 facing the same direction as pads 420 of leadframe 406. As described herein, package 400 may be later mounted onto a substrate, and electrical interconnection with first die 402a may be established by interconnecting pads 420 of leadframe 406 with the substrate.

Figure 6:
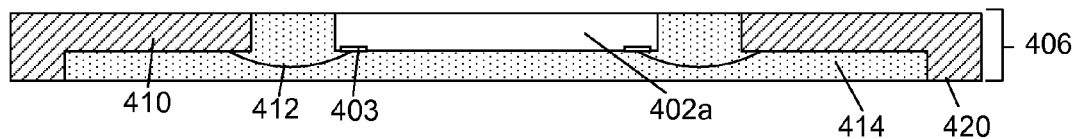

First die 402a and wires 412 may be encapsulated by mold compound 414 as illustrated in FIG. 6. Mold compound 414 may be formed in any appropriate manner and may comprise a resin, epoxy, or the like.

Figure 7:
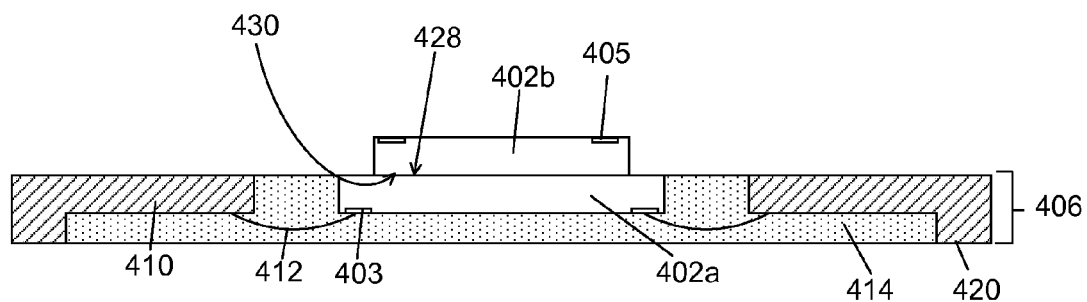

Second die 402b may be mounted onto a back side 428 of first die 402a as illustrated in FIG. 7 in a manner such that first die 402a and second die 402b are in a back-to-back configuration (i.e., back side 428 of first die 402a facing back side 430 of second die 402b). In various embodiments, second die 402b may be affixed to first die 402a using a die-attach material (not illustrated). A die-attach material may comprise any material suitable for resisting movement, at least temporarily, of second die 402b relative to first die 402a. In various embodiments, a die-attach material may be a material selected from a group comprising tape, adhesive, and mold compound.

Figure 8:
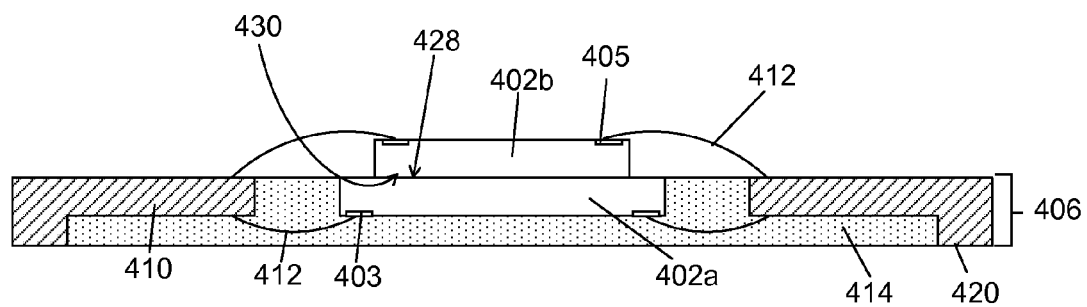
Figure 9:
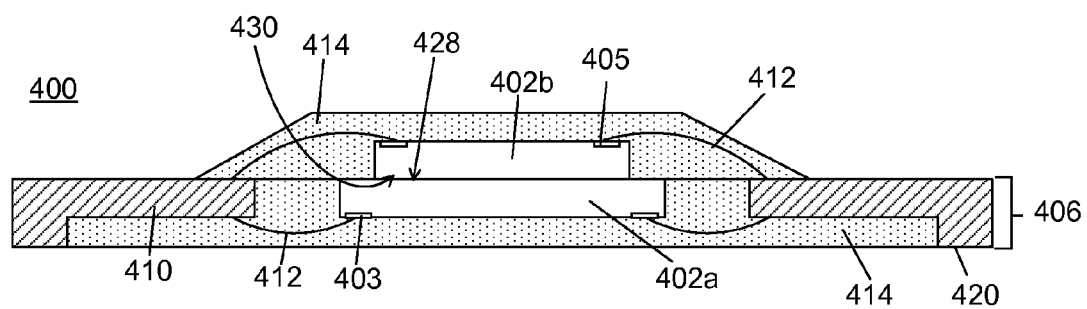

Bond pads 405 of second die 402b may be wire-bonded to lead fingers 410 of leadframe 406 by wires 412 as illustrated in FIG. 8. Then, second die 402b and wires 412 may be encapsulated by mold compound 414 as illustrated in FIG. 9. Mold compound 414 may be formed in any appropriate manner and may comprise a resin, epoxy, or the like. In various embodiments, mold compound 414 used for encapsulating second die 402b may be the same as or may be different from mold compound 414 used for encapsulating first die 402a. Moreover, while the illustrated method generally depicts first die 402a as being encapsulated prior to encapsulating second die 402b, in various other embodiments, first die 402a may be encapsulated by mold compound 414 at the same time as or after encapsulating second die 402b.

Figure 10:
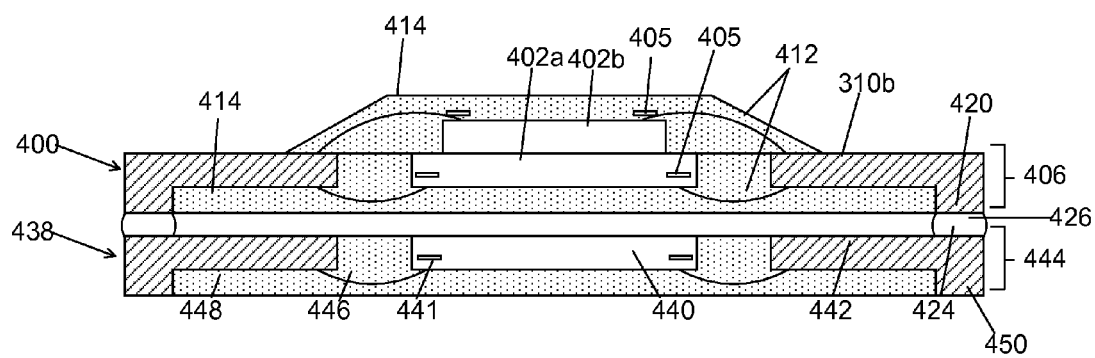
FIG. 10 illustrates a cross-sectional side view of another microelectronic apparatus in accordance with various embodiments of the present invention.

FIG. 9 illustrates a generally complete multi-chip package 400. As described herein, package 400 may then be mounted onto a substrate (e.g., a printed circuit board; not illustrated). In some embodiments, package 400 may be mounted onto another package 438 as illustrated in FIG. 10. In some embodiments, another package may be mounted onto package 400 in addition to or instead of mounting package 400 onto another package.

As illustrated, pads 420 of package 400 may be electrically interconnected with pad 424 of package 438 by a conductive bump 426. Conductive bump 426 may comprise any material suitable for the purpose including, for example, solder.

Package 438 may comprise a die 440. Bond pads 441 may be wire-bonded to lead fingers 442 of a leadframe 444 by wires 446. A mold compound 448 may encapsulate die 440 and wires 446.

Package 438 may then be mounted onto a substrate (e.g., a printed circuit board; not illustrated), and electrical interconnection with die 440, die 402a, or 402b may be established by interconnecting pads 450 of leadframe 444 with the substrate. Package 438 may comprise a die-down package as illustrated or may comprise another type of package.

Figure 11:
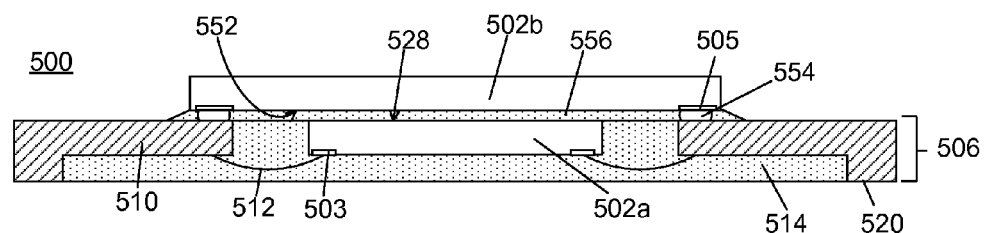
FIG. 11 illustrates a cross-sectional side view of another microelectronic apparatus in accordance with various embodiments of the present invention.

An exemplary embodiment of another multi-chip QFN package in accordance with the present invention is illustrated in FIG. 11. As illustrated, package 500 may include a first die 502a in a die-down configuration, and a second die 502b mounted onto a leadframe 506. Bond pads 503 of first die 502a may be wire-bonded to lead fingers 510 of leadframe 506 by wires 512, and a mold compound 514 may encapsulate first die 502a and wires 512. Package 500 may then be mounted onto a substrate (e.g., a printed circuit board; not illustrated), and electrical interconnection with first die 502a and/or second die 502b may be established by interconnecting pads 520 of leadframe 506 with the substrate.

As may be seen, second die 502b is flip-chip mounted onto leadframe 506. In this configuration, a front side 552 of second die 502b faces a back side 528 of first die 502a. Bond pads 505 of second die 502b may be electrically interconnected with lead fingers 510 of leadframe 506 by conductive bumps 554. An underfill material 556 may be formed between first die 502a and second die 502b.

An exemplary method for making package 500 is illustrated in FIGS. 12-15 as cross-sectional side views at various stages of the method. For clarity, the same reference numerals used with respect to FIG. 11 are used in the discussion to follow with respect to FIGS. 12-15. Also, as noted herein, the various operations discussed and/or illustrated may be generally referred to as multiple discrete operations in turn to help in understanding embodiments of the present invention. The order of description should not be construed to imply that these operations are order dependent, unless explicitly stated. Moreover, some embodiments may include more or fewer operations than may be described.

Figure 12:
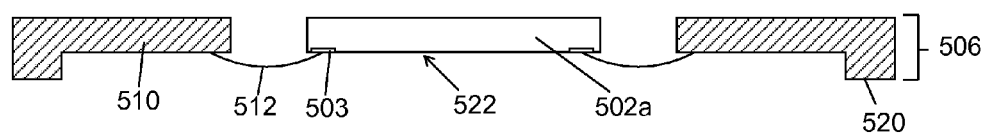
FIGS. 12-15 illustrate cross-sectional side views of the microelectronic apparatus of FIG. 11 at various stages of a method for forming the same in accordance with various embodiments of the present invention.

Turning now to FIG. 12, a leadframe 506 and a first die 502a are provided. Bond pads 503 of first die 502a may be wire-bonded to lead fingers 510 of leadframe 506 by wires 512. First die 502a may be in a die-down configuration, with a front side 522 facing the same direction as pads 520 of leadframe 506. As described herein, package 500 may be later mounted onto a substrate, and electrical interconnection with first die 502a may be established by interconnecting pads 520 of leadframe 506 with the substrate.

Figure 13:
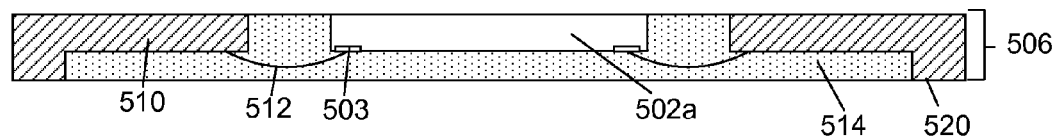

First die 502a and wires 512 may be encapsulated by mold compound 514 as illustrated in FIG. 13. Mold compound 514 may be formed in any appropriate manner and may comprise a resin, epoxy, or the like.

Figure 14:
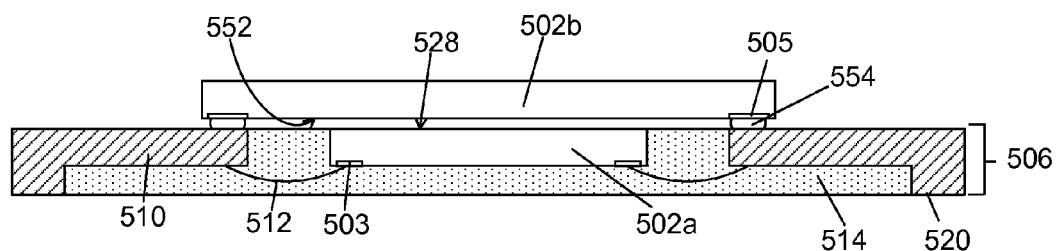

Second die 502b may be flip-chip mounted onto lead fingers 510 of leadframe 506 as illustrated in FIG. 14. Conductive bumps 554, such as, for example, solder bumps, may be used for electrically interconnecting bond pads 505 of second die 502b with leadframe 506.

Figure 15:
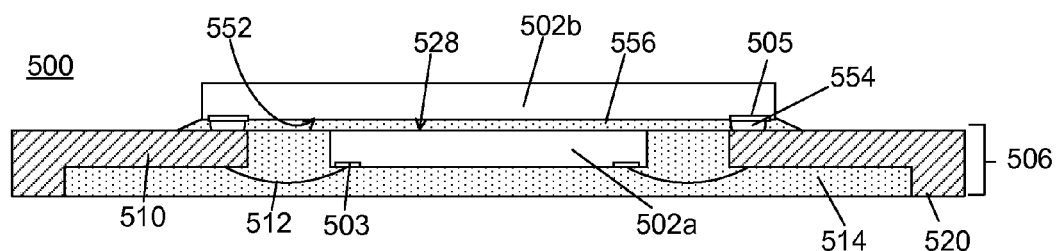

An underfill material 556 may then be formed between first die 502a and second die 502b as illustrated in FIG. 15. Underfill material 556 may be used for absorbing thermal expansion mismatch stresses between second die 502b and leadframe 506, protecting conductive bumps 554, and/or for generally stabilizing and protecting the structure. Underfill material 556 may comprise any material suitable for the purpose including, for example, epoxy, silicone, or the like. Other materials may be similarly suitable.

Figure 16:
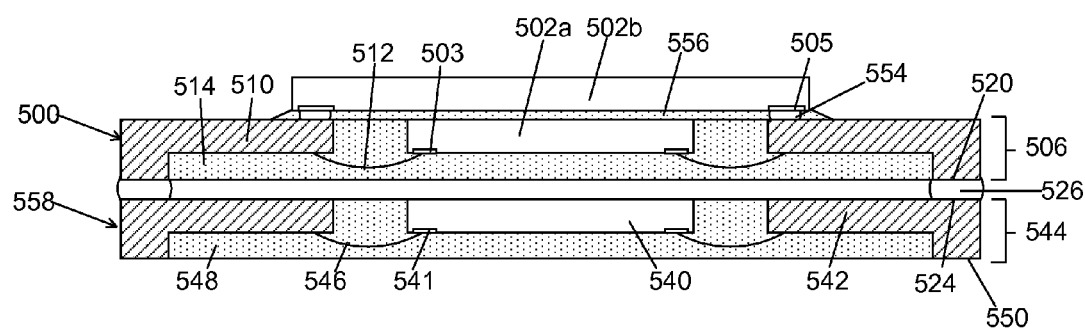
FIG. 16 illustrates a cross-sectional side view of another microelectronic apparatus in accordance with various embodiments of the present invention.

FIG. 15 illustrates a generally complete multi-chip package 500. As described herein, package 500 may then be mounted onto a substrate (e.g., a printed circuit board; not illustrated). In some embodiments, package 500 may be mounted onto another package 558 as illustrated in FIG. 16. In some embodiments, another package may be mounted onto package 500 in addition to or instead of mounting package 500 onto another package.

As may be seen, pads 520 of package 500 may be electrically interconnected with pads 524 of package 558 by a conductive bump 526. Conductive bump 526 may comprise any material suitable for the purpose including solder, for example.

Package 558 may comprise a die 540 including bond pads 541 wire-bonded to lead fingers 542 of a leadframe 544 by wires 546. A mold compound 548 may encapsulate die 540 and wires 546.

Package 558 may then be mounted onto a substrate (e.g., a printed circuit board; not illustrated), and electrical interconnection with die 540, die 502a, or 502b may be established by interconnecting pads 550 of leadframe 544 with the substrate. Package 558 may comprise a die-down package as illustrated or may comprise another type of package.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A semiconductor device comprising:
a leadframe;
a first die including a first bond pad, wherein the first bond pad of the first die is wire-bonded to a first side of the leadframe via a first bond wire, wherein the first die has (i) a first side and (ii) a second side that is opposite the first side of the first die, wherein the first bond pad is disposed on the first side of the first die;
a second die, wherein (i) a first section of the second die is mounted on a second side of the leadframe and (ii) a second section of the second die is over the first die, wherein the second side of the leadframe is opposite to the first side of the leadframe;
a mold compound encapsulating (i) the first bond wire, and (ii) the first side of the first die; and
an underfill material formed (i) between the second section of the second die and the second side of the first die, and (ii) between the first section of the second die and the second side of the leadframe, wherein the underfill material is different from the mold compound.

2. The semiconductor device of claim 1, wherein:
the second die comprises a second bond pad, wherein the second bond pad of the second die is mounted on the second side of the leadframe.

3. The semiconductor device of claim 2, wherein:
the second bond pad of the second die is mounted on the second side of the leadframe via a conductive bump.

4. The semiconductor device of claim 3,
wherein the underfill material encapsulates the conductive bump.

5. The semiconductor device of claim 1, wherein the underfill material is different from the mold compound.

6. The semiconductor device of claim 1, wherein:
the second section of the second die is mounted on the first die such that only the underfill material is between (i) the first die and (ii) the second section of the second die.

7. The semiconductor device of claim 1, wherein the underfill material comprises one of an epoxy and a silicone.

8. The semiconductor device of claim 1, wherein the underfill material stabilizes and protects a structure of the second die mounted on the leadframe.

9. The semiconductor device of claim 1, wherein:
the second section of the second die is mounted on the first die such that the leadframe is not present between (i) the first die and (ii) the second section of the second die.

10. The semiconductor device of claim 1, wherein:
the first die has (i) a first side and (ii) a second side that is opposite the first side of the first die;
the first bond pad is disposed on the first side of the first die;
the second die has (i) a first side and (ii) a second side that is opposite the first side of the second die;
the second side of the first die faces the first side of the second die; and
the first side of the first section of the second die is mounted on the leadframe.

11. The semiconductor device of claim 10, further comprising:
an underfill material formed between (i) the second side of the first die and (ii) the first side of the second die.

12. The semiconductor device of claim 1, wherein the mold compound comprises a resin or an epoxy.

13. The semiconductor device of claim 1, wherein the second die is flip-chip mounted on the leadframe.

14. The semiconductor device of claim 1, wherein:
the leadframe, the first die, and the second die form a first semiconductor package; and
the semiconductor device further comprises a second semiconductor package, wherein the first semiconductor package is coupled to the second semiconductor package.

15. The semiconductor device of claim 14, wherein the first semiconductor package is electrically interconnected with the second semiconductor package by a plurality of conductive bumps.

* * * * *